(12) United States Patent
Wei et al.

(10) Patent No.: US 6,538,888 B1
(45) Date of Patent: Mar. 25, 2003

(54) RADIAL BASE HEATSINK

(75) Inventors: Wen Wei, Beaverton, OR (US); Michael A. Stapleton, Portland, OR (US); Richard F. Guarnero, Scappose, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,476

(22) Filed: Sep. 28, 2001

(51) Int. Cl.[7] .................................................. H05K 7/20
(52) U.S. Cl. ........................ 361/697; 165/121; 415/177; 29/890.03
(58) Field of Search .......................... 257/722; 361/687, 361/695, 697, 703–705, 709–712, 717–719; 174/16.3; 165/121–126, 80.3, 185; 454/184; 415/177, 178, 213.1, 214.1; 29/890.03, 890.046, 890.05

(56) References Cited

U.S. PATENT DOCUMENTS

| | | | | |
|---|---|---|---|---|
| 5,494,098 A | * | 2/1996 | Morosas | 165/121 |
| 5,597,034 A | * | 1/1997 | Barker, III et al. | 165/80.3 |
| 5,794,685 A | * | 8/1998 | Dean | 165/121 |
| 5,884,691 A | * | 3/1999 | Batchelder | 165/80.3 |
| 5,946,190 A | * | 8/1999 | Patel et al. | 361/700 |
| 6,219,242 B1 | * | 4/2001 | Martinez | 361/704 |
| 6,367,542 B1 | * | 4/2002 | Chen | 165/80.3 |
| 6,386,274 B1 | * | 5/2002 | Wang et al. | 165/80.3 |
| 6,401,808 B1 | * | 6/2002 | Hanzlik et al. | 165/121 |
| 6,411,510 B2 | * | 6/2002 | Sasa et al. | 361/697 |

* cited by examiner

Primary Examiner—Gerald Tolin
(74) Attorney, Agent, or Firm—Antonelli, Terry, Stout & Kraus, LLP

(57) ABSTRACT

A radial base heatsink is provided to dissipate heat from a heat source. Such a heatsink comprises a cylindrical core; and a plurality of cooling fins projecting outwardly from the cylindrical core and defining a series of channels in a substantially radial pattern with a fin orientation relative to a center line of the cylindrical core, for dissipating heat generated from a heat source, via the cylindrical core.

32 Claims, 11 Drawing Sheets

Aligned pattern

FIG. 14B

Offset pattern

FIG. 14C

Interleaved pattern

RADIAL BASE HEATSINK

TECHNICAL FIELD

The present invention relates to heatsinks for electronic components, and more particularly, relates to an advanced radial base heatsink comprising a cylindrical core with a conduction enhanced base and a series of cooling fins extended therefrom in a substantial radial pattern with a fin orientation relative to a center line optimized to provide a low thermal resistance connection to the base and minimize air flow impedance.

BACKGROUND

Modern electronic appliances such as computer systems have not only microprocessor chips, including Intel® i386, i486, Celeron™ or Pentium® processors, but also many hundreds of integrated circuits (ICs) and other electronic components, most of which are mounted on printed circuit boards (PCBs). Many of these components generate heat during normal operation. Components that have a relatively small number of functions in relation to their size, as for example individual transistors or small scale integrated circuits (ICs), usually dissipate all their heat without a heat sink. However, as these components become smaller and smaller to the extent that many thousands are now combined into a single integrated circuit (IC) chip or an electronic package, and operate faster and faster to provide the computing power that is increasingly required, the amount of heat which the components dissipated increasingly require the assistance of external cooling devices such as heatsinks.

Heatsinks are typically passive devices, for example an extruded aluminum plate with a plurality of fins, that is thermally coupled to a heat source, i.e., an electronic package such as a microprocessor to absorb heat from the electronic component. The heatsinks dissipate this heat into the air by convection. Generally there are several types of heatsinks available for dissipating heat from an electronic package.

Typical heatsinks are copper (Cu) or aluminum (Al) based heatsinks with either folded fins or skived fins With no fan or an active fan on top to promote airflow efficiency. A retention mechanism such as a clip is required to secure the heatsink onto an electronic package across the heat dissipation path. An active fan is often mounted on top of the heatsinks to transfer heat, during operation, from a heat source (electronic package) to the ambient air, via the folded or skived fins. For copper based heat sinks with folded fins, the retention mechanism may be elaborate and often interfere with the heat dissipation path directly over a heat source. In addition, copper based heatsinks can be heavy and expensive to manufacture. Moreover, the fin surface area can be limited with high airflow resistance or heat sink impedance.

Another common example is a Mushroom based Arctic heatsink with either machined or extruded fins. Typically, a fan is installed inside the housing, i.e., a generally cylindrically shaped fan chamber of the Mushroom based Arctic heatsink. The housing surrounding the fan is constructed of a series of cooling vanes (fins) which have elongated openings therebetween allowing air to pass between and cool the vanes (fins). The vanes are angled in an approximately opposite manner to the angle of the fan blades in order to reduce operation noise while improving heat dissipation. However, the Mushroom based Arctic heatsink tends to be more expensive to manufacture as the design is far more complex to house an internal fan. Moreover, the thermal resistance and heat transfer efficiency may not be maximized since the mushroom base is limited with less contact with extending vanes (fins) and less cooling surface area for heat transfer.

Accordingly, there is a need to provide a lower cost and thermal resistance alternative to flat, rectangular folded fin or skived fin heatsinks, Mushroom based Arctic heatsinks and other active coolers.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein:

FIGS. 14A–4C illustrate an example fin angle and fin pattern of an example radial base heatsink with straight fins or angled fins according to an embodiment of the present invention;

FIGS. 15A–5D illustrate example fin shapes of an example radial base heatsink with straight fins or angled fins according to an embodiment of the present invention;

DETAILED DESCRIPTION

The present invention is applicable for use with all types of electronic packages and IC devices such as Intel® i386, i486, Celeron™ or Pentium® processors, including new microprocessor chips which may become available as computer technology develops in the future. Further, the present invention is not limited to use in computer systems, but is suitable for applications in many industries and/or environments such as automotive, telecommunications, etc. However, for the sake of simplicity, discussions will concentrate mainly on exemplary use of a heatsink assembly to be mounted onto a system board of a computer system, although the scope of the present invention is not limited thereto.

Figure 1:
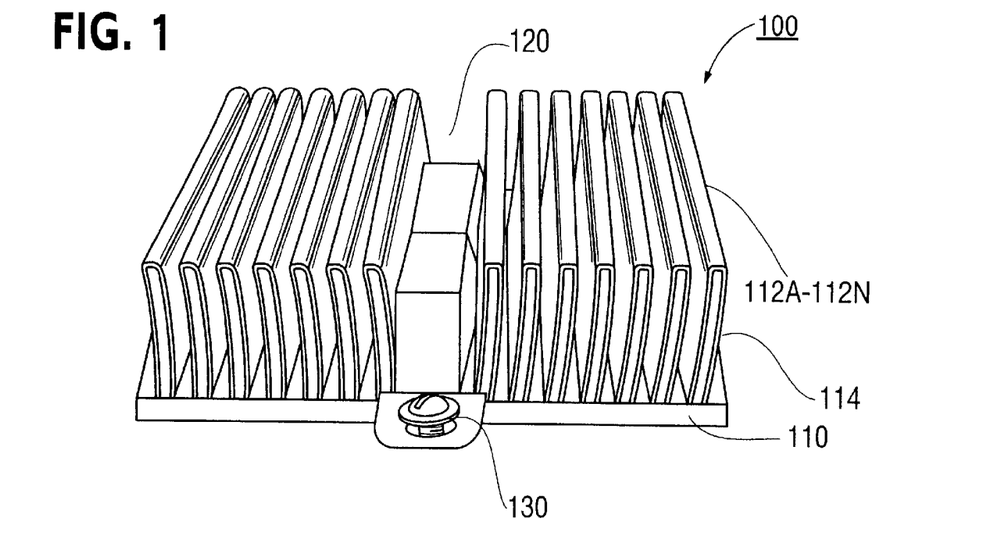
FIG. 1 illustrates an example copper (Cu) or aluminum (Al) based heatsink with folded fins.

Attention now is directed to the drawings and particularly to FIG. 1, an example copper (Cu) or aluminum (Al) based heatsink with folded fins for is illustrated. As shown in FIG. 1, the copper (Cu) or aluminum (Al) based heatsink 100 may include a heat spreader base 110 with a flat bottom surface and a large number of cooling (radiation) fins 112A–112N extending perpendicularly or projecting upwardly from the heat spreader base 110. The heat spreader base 110 may generally be a rectangular plate and its size may be co-extensive with the size of an electronic packet (not shown). In addition, the heatsink 100 may also include a channel 120 in a central region extending across the heat spreader base 110 for purposes for accommodating a separate retention mechanism such as a retainer clip 130 to secure the heatsink 100 and the electronic package onto a socket (not shown).

Usually, the heat spreader base 110 and fins 112A–112N may be integrally formed from a strip of metal foil, such as copper (Cu) or aluminum (Al) sheet material. The fins 112A–112N comprise folded portions of the metal foil, having two adjacent portions joined at a fold 114 at the edge of the fins 112A–112N. Often times the folded fins 112A–112N may be bonded in a thermally conductive way onto the heat spreader base 110, by way of adhesive for example.

However, the copper (Cu) or aluminum (Al) based heat sink with folded fins can be heavy and expensive to manufacture. In addition, an elaborate retainer clip 130 is required and often interfere with the heat dissipation path directly over a heat source, i.e., an electronic package. Moreover, the fin surface area can be limited with high airflow resistance or heat sink impedance.

Figure 2:
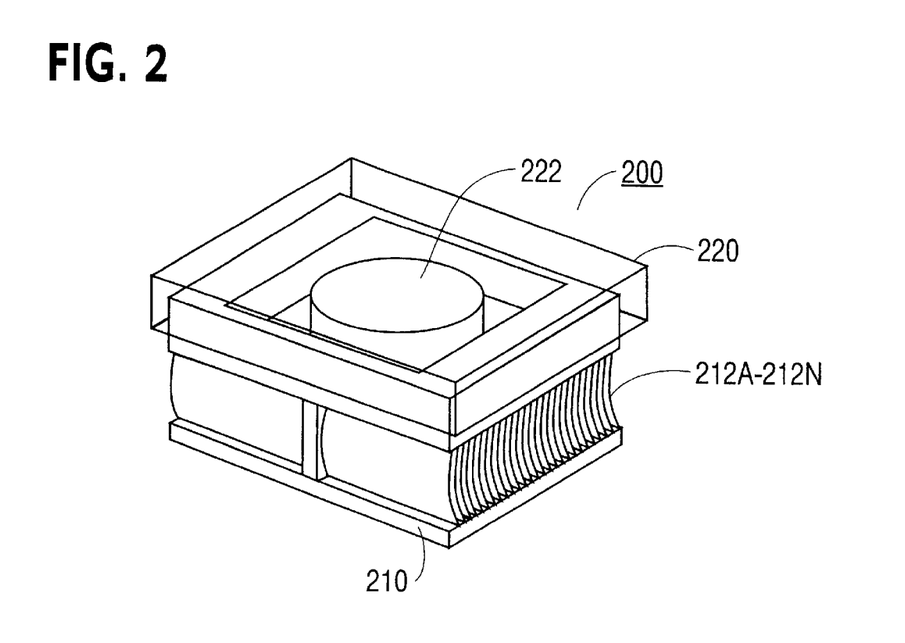
FIG. 2 illustrates an example copper (Cu) or aluminum (Al) based heatsink with skived fins.

FIG. 2 illustrates an example copper (Cu) or aluminum (Al) based heatsink with skived fins. As shown in FIG. 2, the skived heatsink 200 may include a longitudinally extending heat spreader base 210 and a large number of skived fins 212A–212N extending perpendicularly or projecting upwardly from the heat spreader base 210. The heat spreader base 210 may also be a rectangular plate and its size may be co-extensive with the size of an electronic packet (not shown). The fins 212A–212N may be created using a process which "skives" the fins from extruded sheets of metal, such as copper (Cu) or aluminum (Al), with a high production throughput.

Typically, a sharpened tool may be brought into angular contact with the surface of the copper (Cu) or aluminum (Al) sheet to repeatedly form fins which are spaced very close together. Aspect ratios (e.g. height/gap) of greater than 8, and nominally 10, are generally necessary to adequately dissipate heat from an electronic package. Each fin 212A–212M may identically match the thermal coefficient of the underlying surface of base 210 because the fin is a carved part of the base surface 210.

In either folded fin or skived fin heatsinks as described with reference to FIGS. 1–2, a fan structure 220 including an active fan installed on a fan hub 222 may be mounted on top of the heatsink 200, for example, in order to promote heat transfer and airflow efficiency, during operation, from an electronic component to the ambient air, via the folded or skived fins.

Skived fin heatsinks may typically lower in cost than conventional folded fin heatsinks which require individual fins to be bonded in a thermally conductive way to the base. However, the skived fin heatsinks can still be heavy and expensive to manufacture. In addition, the fin surface area can also be limited with high airflow resistance or heat sink impedance and low heatsink efficiency as described with reference with FIG. 3 hereinbelow.

Figure 3:
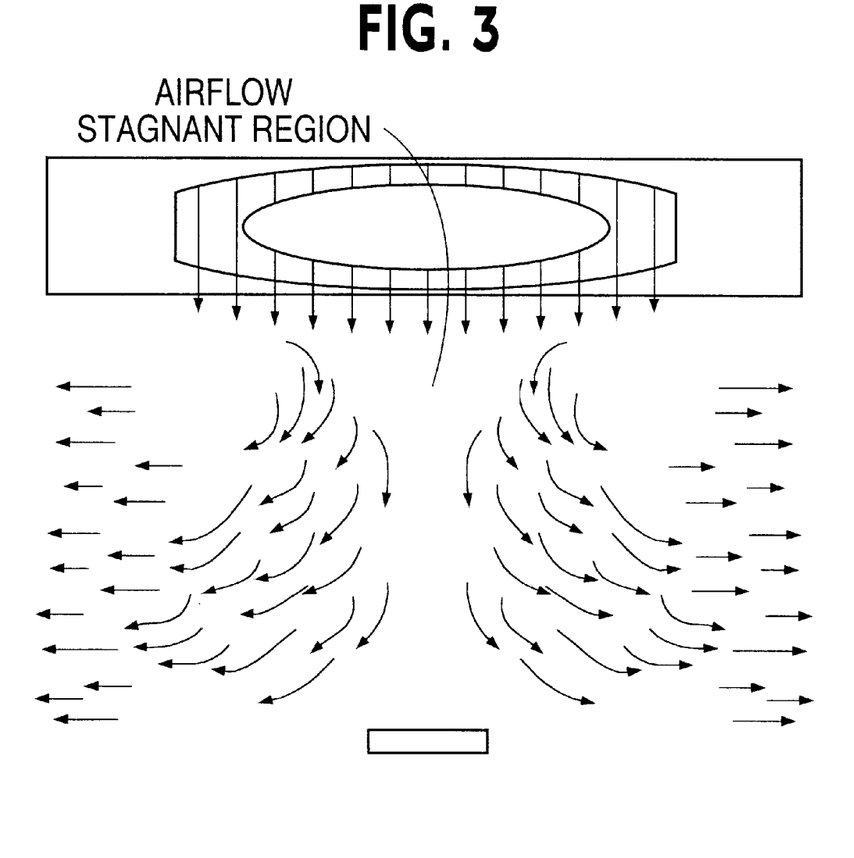
FIG. 3 illustrates an airflow simulation result of the copper (Cu) or aluminum (Al) based heatsink with skived fins shown in FIG. 2.

FIG. 3 illustrates an airflow simulation result of the copper (Cu) or aluminum (Al) based heatsink 200 with skived fins 212A–212N shown in FIG. 2. When the heatsink 200 with skived fins 212A–212N is secured on top of an electronic package (not shown), the cylindrical base is under a fan hub 222 where a heat stagnation region is present. Heat will be removed by the airflow under the fan blade area. However, the heat stagnation region leads to lower fin efficiency.

Figure 4A:
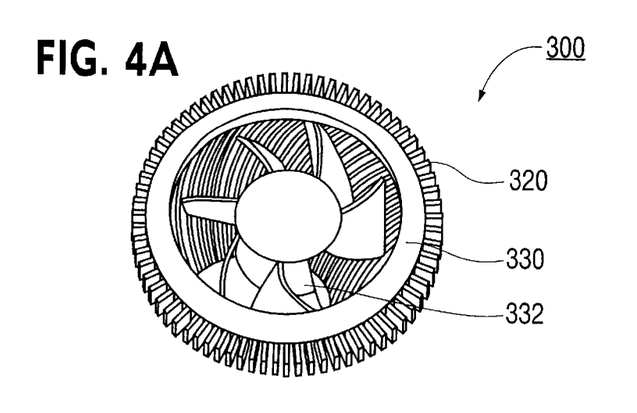
FIGS. 4A–4B illustrate an example Mushroom based Arctic heatsink with an active fan mounted internal to fins.
Figure 4B:
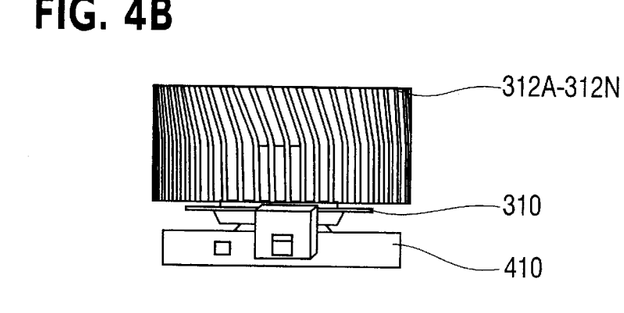

FIGS. 4A–4B illustrate another common heatsink, known as a Mushroom based Arctic heatsink 300 with machined or extruded fins 312A–312N positioned on top of a socket 410 supporting a heat source, i.e., an electronic package such as a microprocessor. The heatsink 300 may include a Mushroom base 310 and a series of cooling vanes (fins) 312A–312N extending outwardly and then projecting upwardly from the Mushroom base 310 to form a housing 320, i.e., a generally cylindrically shaped fan chamber of the Mushroom based Arctic heatsink 300.

Typically, a fan structure 330 including an active fan 332 may be installed inside the housing 320 of the Mushroom based Arctic heatsink 300. The series of cooling vanes (fins) 312A–312N may contain elongated openings (slots) therebetween for allowing air to pass between and cool the vanes (fins). The vanes (fins) 312A–312N may be angled in an approximately opposite manner to the angle of the fan blades in order to reduce operation noise while improving heat dissipation. However, the Mushroom based Arctic heatsink 300 tends to be more expensive to manufacture as the design is far more complex to house an internal fan. Moreover, the thermal resistance and heat transfer efficiency may not be maximized since the Mushroom base is limited with less contact with extending vanes (fins) and less cooling surface area for heat transfer.

Figure 5:
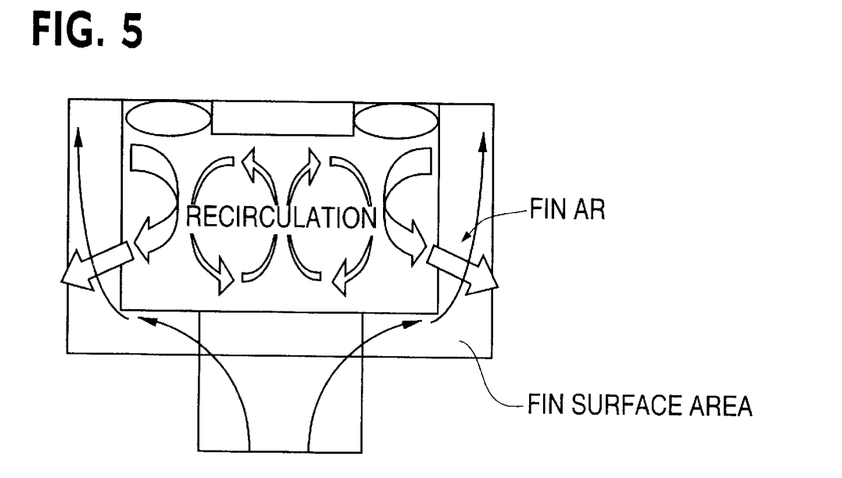
FIG. 5 illustrates an airflow simulation result of the Mushroom based Arctic heatsink with an active fan mounted internal to fins shown in FIGS. 4A–4B.

FIG. 5 illustrates an airflow simulation result of the Mushroom based Arctic heatsink with an active fan mounted internal to fins shown in FIGS. 4A–4B. As can be seen from the arrows shown in FIG. 5, the airflow may be recirculated within the housing 320 of the Mushroom based Arctic heatsink 300 and eventually exited via the elongated openings of the vanes (fins) 312A–312N. Airflow recirculation within the housing (chamber) 320 of the Mushroom based Arctic heatsink 300 may cause air pressure to drop, resulting in relatively high airflow loss and low heatsink efficiency.

Turning now to FIGS. 6A–6D, 7A–7D and 8–12, a variety of lower cost and thermal resistance alternative solutions to flat, rectangular folded fin or skived fin heatsinks as described with reference to FIGS. 1–2, Mushroom based Arctic heatsinks as described with reference to FIGS. 4–5 and other active coolers according to an embodiment of the present invention are illustrated. Radial base heatsinks with a substantially solid cylindrical core having a conduction enhanced cylindrical base and different cooling fins configurations extending from the cylindrical core are advantageously provided to produce up to twice the thermal performance of typical rectangular folded fin or skived fin heatsinks or Mushroom based Arctic heatsinks heatsinks in the same or smaller volume. Cooling fins may be attached to or mounted onto (by way of solder, adhesive or other low thermal resistance material), extruded from or machined from the cylindrical core in a substantial radial pattern with a fin orientation relative to a center line of the cylinder optimized (i.e., straight or angled to match fan swirl). Each of the cooling fins can have its height optimized in accordance with its location on the cylindrical core, and its length optimized in accordance with its location on the cylindrical core separated by cuts. Likewise, the cylindrical core can also have its dimension optimized (straight or tapered) to spread heat uniformly and more efficiently from a heat source, i.e., an electronic package such as a microprocessor to all the cooling fins. A typical size of a radial base heatsink may be approximately 3 inches with the cylindrical core exhibiting a relatively small diameter of, for example, 1.125 inches, and the cooling fins exhibiting a length of, for example, 1.875 inches.

In addition, the cylindrical core can be provided with an option for an integrated heat pipe, a vapor camber of high thermal conductivity material. For example, a heat pipe (generally a cylindrical structure constructed of a conductive material, such as copper) may be disposed within a central portion of the cylindrical core to enhance the conduction or spreading efficiency inside the base to further dissipate the heat received from a heat source.

Figure 6A:
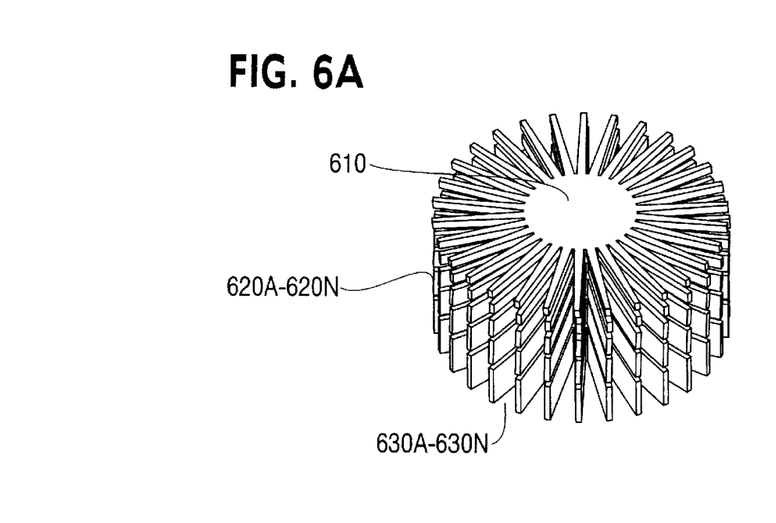
FIGS. 6A–6D illustrate an example advanced radial base heatsink with straight fins according to an embodiment of the present invention.
Figure 6B:
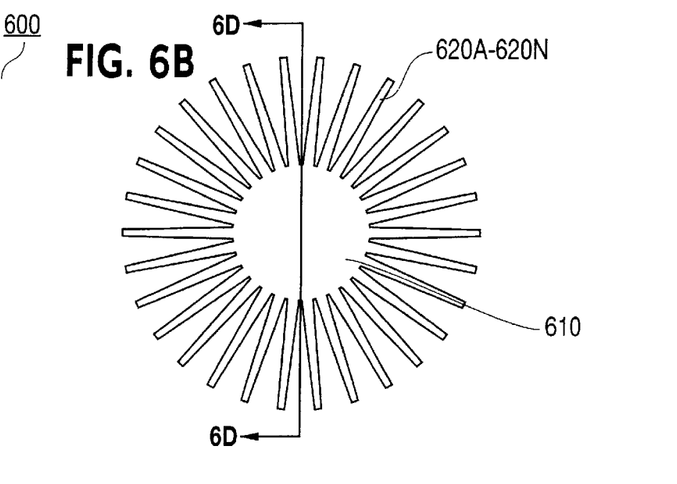
Figure 6C:
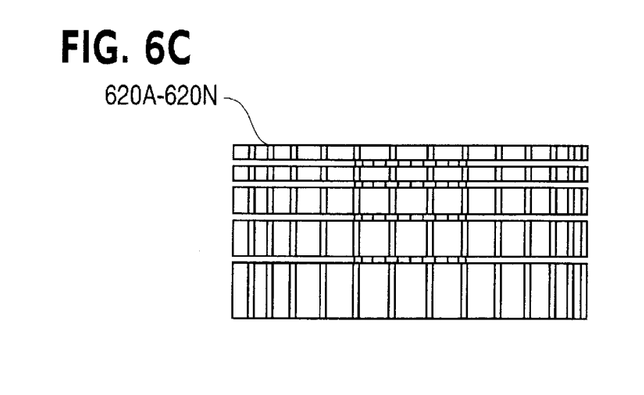
Figure 6D:
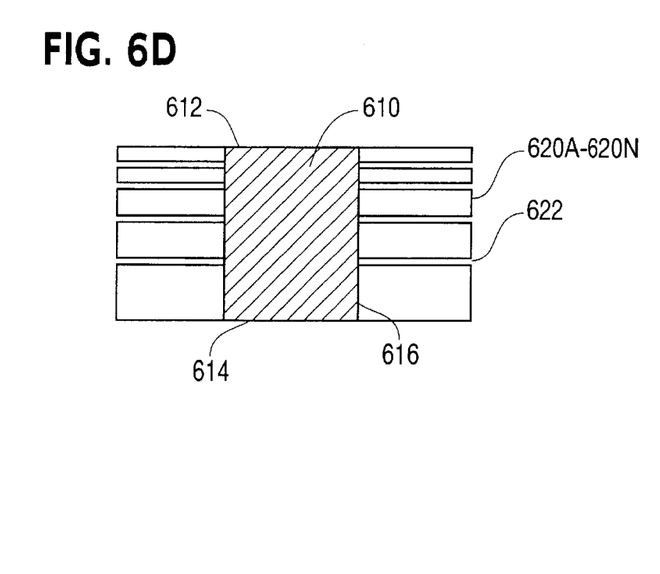

Referring now to FIGS. 6A–6D, an example radial base heatsink with straight fins according to an embodiment of the present invention is illustrated. More specifically, FIG. 6A illustrates an isometric view of an advanced radial base heatsink with straight fins according to an embodiment of the present invention. FIGS. 6B–6D illustrate orthographic views of the same radial base heatsink according to an embodiment of the present invention. As will be described with reference to FIGS. 6A–6D herein below, the radial base heatsink according to an embodiment of the present invention advantageously provides a low cost, quiet, lightweight heatsink solution that can provide up to twice the thermal performance of typical heatsinks in the same or smaller volume.

As shown in FIG. 6A, an advanced heatsink 600 comprises a substantially solid cylindrical core 610 and a series of cooling fins 620A–620N projecting outwardly or extending from the cylindrical core 610 and defining a series of channels 630A–630N in a substantial radial pattern with a fin orientation relative to a center line of the cylindrical core 610 as shown in FIG. 6B in order to dissipate heat from a heat source, i.e., an electronic package (not show) while providing a low thermal resistance connection to the base and minimizing air flow impedance.

In an embodiment of the present invention, the cooling fins 620A–620N may be machined from the cylindrical core 610 of the same material to provide a low resistance thermal path from the base surface 614 to cooling fins 620A–620N. For example, the radial base heatsink 600 including the cylindrical core 610 and the cooling fins 620A–620N can be machined or constructed from a single metallic conduction based material, such as aluminum (Al). The radial base heatsink 600 may also be constructed of any metallic material that is light weight and has a high level of thermal conductivity, such as a copper-tungsten alloy, aluminum nitride, beryllium oxide or copper. Separately, the cooling fins 620A–620N may alternatively be attached to or mounted onto (by way of solder, adhesive or other low thermal resistance material) the cylindrical core 610 of the same or different high thermal conduction material.

As shown in FIG. 6D, the cylindrical core 610 includes a substantially planar top surface 612, a substantially planar base (bottom) surface 614 adapted to contact a heat source, i.e., an electronic package such as a microprocessor, and a peripheral outer wall 616 extended from the top surface 612 to the base (bottom) surface 614. The cylindrical core 610 may have a small uniform diameter at the heat exchange base surface 614 adapted to contact a heat source and at the top surface 612 adapted to accommodate a fan hub (not shown) to reduce turbulent airflow. The cylindrical core 610 may exhibit a high level of conductivity if enhanced using a vapor chamber, a heat pipe, and high thermal conductive material.

In addition, the cooling fins 620A–620N extending from the cylindrical core 610 in a radial pattern may be cut several times and separated by cut lines 622 along a horizontal direction relative the center line of the cylindrical core 610, to a peripheral outer wall 616 of the cylindrical core 610 as shown in FIGS. 6C–6D. This way individual cooling fins 620A–620N can be uniformly arranged along vertical and horizontal directions on a peripheral outer wall surface of the cylindrical core 610. The cuts on cooling fins 620A–620N, and cut lines separating the cooling fins 620A–620N in the horizontal direction relative to the center line of the cylindrical core 610 are intended to reduce the pressure drop as a function of air flow rate and thereby obtaining higher fin efficiency.

As described with reference to FIGS. 6A–6D, radial mounting of the cooling fins 620A–620N advantageously allows high fin density at the cylindrical core 610 with greater spacing (channels) between the fins 620A–620N further out, thereby allowing more than twice the fin surface area in the same volume and less airflow restriction. High fin efficiency may be obtained by providing a low resistance thermal path from the small diameter base surface 614 of the cylindrical core 610 to the cooling fins 620A–620N where heat is removed by concentrated airflow under a fan blade area.

Figure 7A:
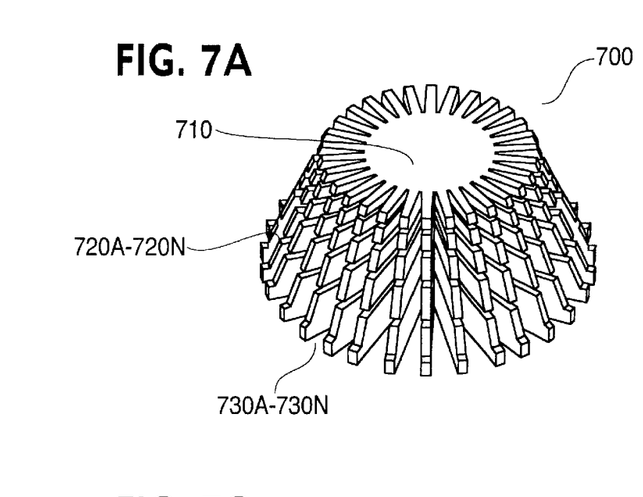
FIGS. 7A–7D illustrate an example advanced radial base heatsink with angled fins according to an embodiment of the present invention.
Figure 7B:
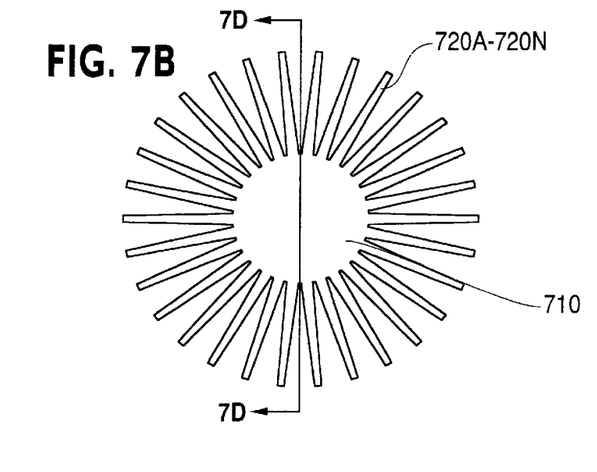
Figure 7C:
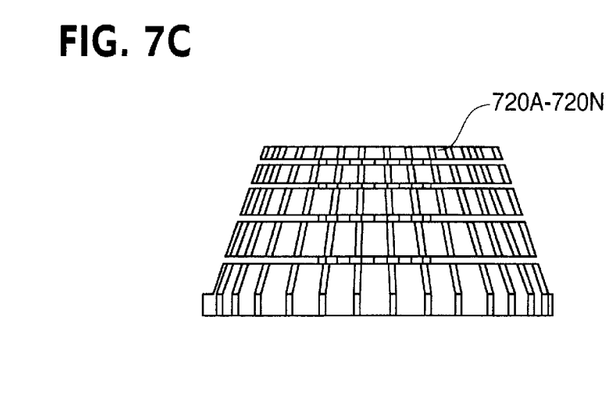
Figure 7D:
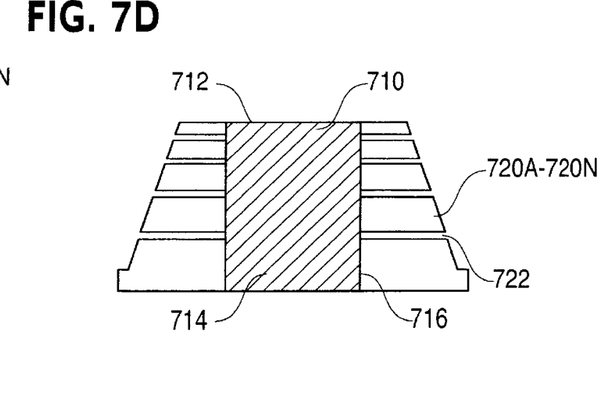

FIGS. 7A–7D illustrate an example radial base heatsink with angled fins according to an embodiment of the present invention. More specifically, FIG. 7A illustrates an isometric view of an advanced radial base heatsink with angled fins according to an embodiment of the present invention. FIGS. 7B–7D illustrate orthographic views of the same radial base heatsink with angled fins according to an embodiment of the present invention.

As shown in FIG. 7A, an advanced heatsink 700 also comprises a substantially solid cylindrical core 710 and a series of cooling fins 720A–720N projecting outwardly or extending from the cylindrical core 710 and defining a series of channels 730A–730N in a substantial radial pattern with a fin orientation relative to a center line of the cylindrical core 710 as shown in FIG. 7B. The cylindrical core 710 and cooling fins 720A–720N can also be machined or constructed from any light weight conduction based material, such as aluminum (Al).

As shown in FIG. 7D, the cylindrical core 710 also includes a substantially planar top surface 712 adapted to accommodate a fan hub, a substantially planar base (bottom) surface 714 adapted to contact a heat source, i.e., an electronic package such as a microprocessor, and a peripheral outer wall 716 extended from the top surface 712 to the base (bottom) surface 714.

The cooling fins 720A–720N extending from the cylindrical core 710 in a substantially radial pattern may be tapered at the top of the cylindrical core 710 at a predetermined angle (for example, $\alpha$=0 to 25°) to reduce airflow impedance or resistance, and thereby increasing airflow efficiency. This is because cooling fins farthest away from the heat source are generally less efficient and, hence, can be reduced in size for efficiency purposes. In addition, the cooling fins 720A–720N may also be cut several times and separated by cut lines 722 along a horizontal direction relative the center line of the cylindrical core 710, to a peripheral outer wall 716 of the cylindrical core 710 as shown in FIGS. 7C–7D. This way individual cooling fins 720A–720N can be uniformly arranged along vertical and horizontal directions on a peripheral outer wall surface of the cylindrical core 710. The cuts on cooling fins and cut lines separating the cooling fins are intended to reduce the pressure drop as a function of air flow rate and thereby higher fin efficiency. As a result, the length and height of the cooling fins 720A–720N can be optimized depending on the location on the cylindrical core 710.

FIGS. 8–11 illustrate an example radial base heatsink with a different type of fins, such as conical fins, pin type fins, airfoil fins and pre-fabricated bonded fins, optimized for increased fin surface area, fin efficiency and airflow according to the present invention. For radial base heatsinks with conical fins, pin-type fins and airfoil fins, the fin shape, fin orientation, fin length, fin width and base shape can all be varied. In addition, the radial base heatsinks can be machined or constructed from a single metallic conduction based material. However, for radial base heatsinks with pre-fabricated bonded fins, optimization opportunities such as the fin shape, fin orientation, fin length, fin width and base shape may not be as easily varied since the prefabricated bonded fins may need to be mounted onto or attached to the cylindrical core using a thermally resistive barrier such as a solder or pressure.

Figure 8:
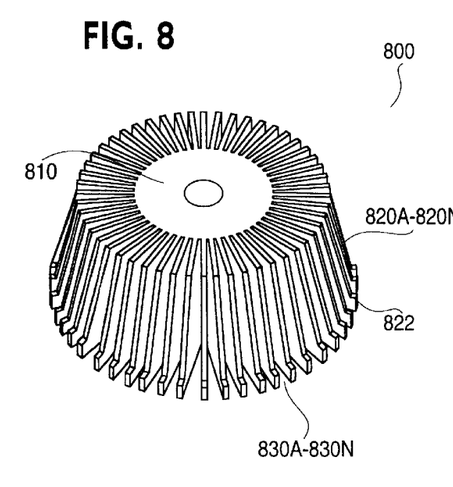
FIG. 8 illustrates an example advanced radial base heatsink with conical fins according to an embodiment of the present invention.

For example, FIG. 8 illustrates an example radial base heatsink with conical fins according to an embodiment of the present invention. As shown in FIG. 8, the radial base heatsink 800 comprises a substantially solid cylindrical core 810 and a series of elongated conical fins 820A–820N projecting outwardly or extending from the cylindrical core 810 and defining a series of channels 830A–830N in a substantial radial pattern with a fin orientation relative to a center line of the cylindrical core 810 in order to dissipate heat from a heat source, i.e., an electronic package (not show). The conical fins 820A–820N may have edges 822 at the distal end of the base to minimize airflow impedance.

Figure 9:
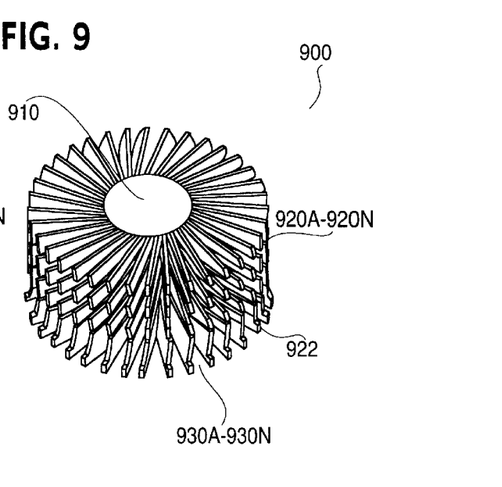
FIG. 9 illustrates an example advanced radial base heatsink with pin type fins according to an embodiment of the present invention.

Similarly, FIG. 9 illustrates an example advanced heatsink with pin type fins according to an embodiment of the present invention. As shown in FIG. 9, the radial base heatsink 900 comprises a substantially solid cylindrical core 910 and a series of elongated pin-type fins 920A–920N projecting outwardly or extending from the cylindrical core 910 and defining a series of channels 930A–930N in a substantial radial pattern with a fin orientation relative to a center line of the cylindrical core 910 in order to dissipate heat from a heat source, i.e., an electronic package (not show). The pin-type fins 920A–920N may also have edges 922 at the distal end of the base to minimize airflow impedance.

Figure 10:
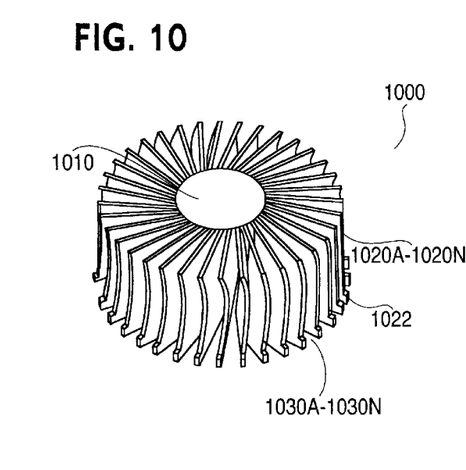
FIG. 10 illustrates an example advanced radial base heatsink with airfoil fins according to an embodiment of the present invention.

Likewise, FIG. 10 illustrates an example radial base heatsink with airfoil fins according to an embodiment of the present invention. As shown in FIG. 10, the radial base heatsink 1000 comprises a substantially solid cylindrical core 1010 and a series of elongated airfoil fins 1020A–1020N projecting outwardly or extending from the cylindrical core 1010 and defining a series of channels 1030A–1030N in a substantial radial pattern with a fin orientation relative to a center line of the cylindrical core 1010 in order to dissipate heat from a heat source, i.e., an electronic package (not show). The airfoil fins 1020A–1020N may also have edges 1022 at the distal end of the base to minimize airflow impedance, and may be bent in the general direction of the fan swirl.

Figure 11:
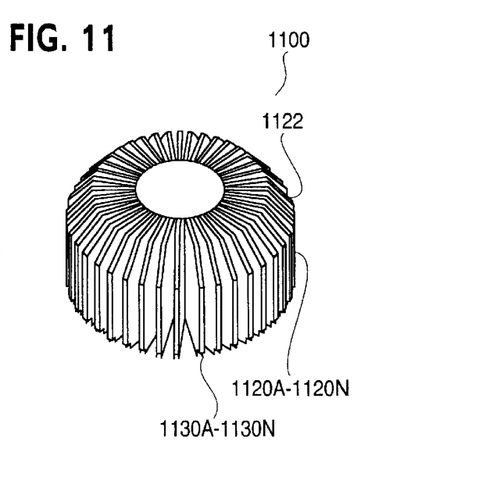
FIG. 11 illustrates an example advanced radial base heatsink with pre-fabricated bonded fins according to an embodiment of the present invention.

FIG. 11 illustrates an example radial base heatsink with pre-fabricated bonded fins according to an embodiment of the present invention. As shown in FIG. 11, the radial base heatsink 1100 comprises a substantially solid cylindrical core 1110 and a series of elongated bonded fins 1120A–1120N projecting outwardly or extending from the cylindrical core 1110 and defining a series of channels 1130A–1130N in a substantial radial pattern with a fin orientation relative to a center line of the cylindrical core 1110 in order to dissipate heat from a heat source, i.e., an electronic package (not show). The pre-fabricated bonded fins 1120A–1120N may be mounted along vertical lines of the cylindrical core 110. Each fin may be an elongated strip of a metallic sheet material such as aluminum (Al) or copper (Cu) having a thickness in the range, for example, of about 0.025 mm to 0.25 mn. The metallic sheet may be folded, and adjacent portions joined at a fold at the edge of the fins.

In all embodiments of the present invention as shown in FIGS. 6A–6D, 7A–7D and 8–11, the cylindrical core of the radial base heatsink with straight fins, angled fins, conical fins, pin type fins, airfoil fins or pre-fabricated bonded fins can also be tapered.

Figure 12:
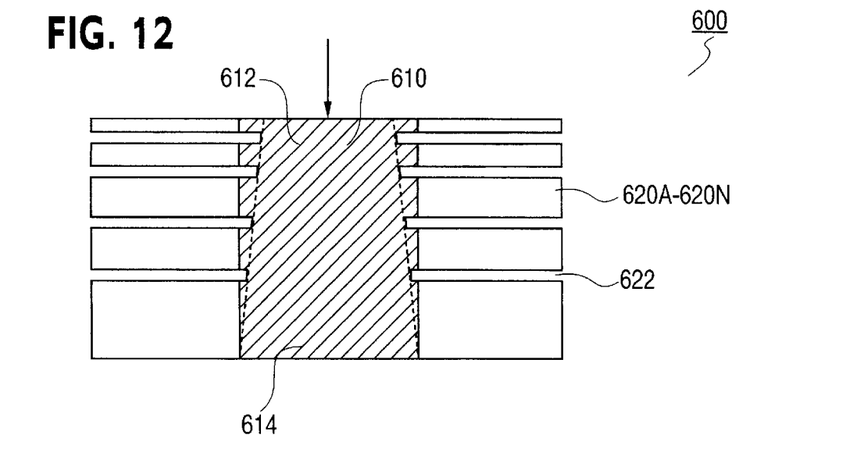
FIG. 12 illustrates a cross-sectional view of an example radial base heatsink according to an embodiment of the present invention.

For example, FIG. 12 illustrates a cross-sectional view of the radial base heatsink 600 with straight fins in which the top portion of the cylindrical core 610 is tapered to reduce airflow impedance. The core 610 may have a conic shape so that the base surface 614 may be larger than the top surface 612 to reduce airflow resistance.

Figure 13A:
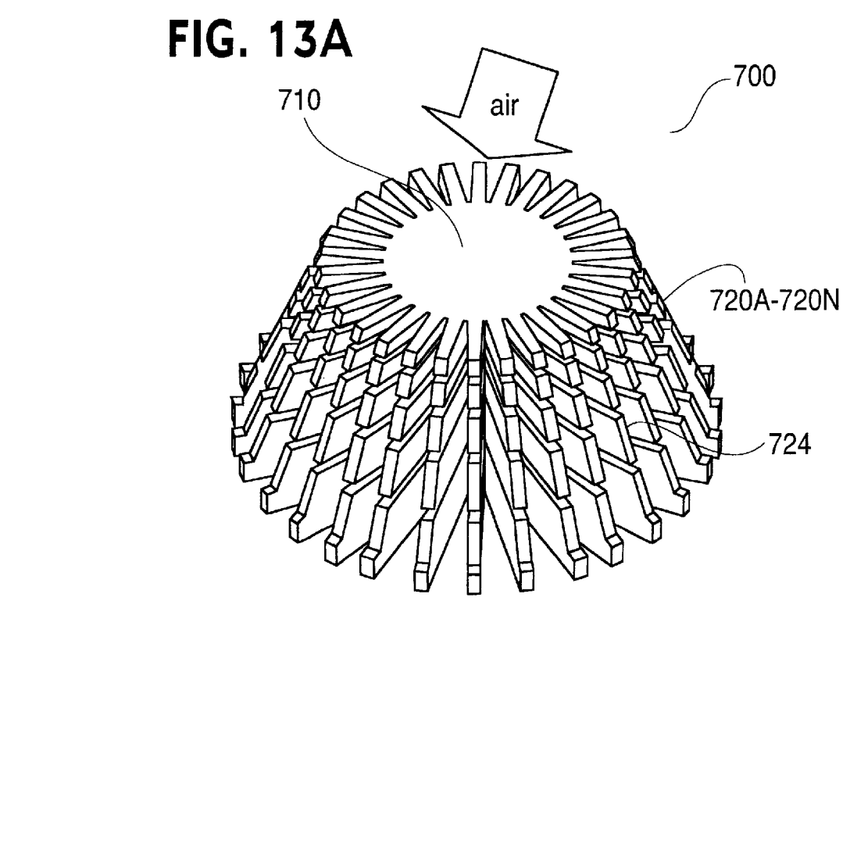
FIGS. 13A–13B illustrate an airflow direction of an example radial base heatsink with straight fins or angled fins according to an embodiment of the present invention.
Figure 13B:
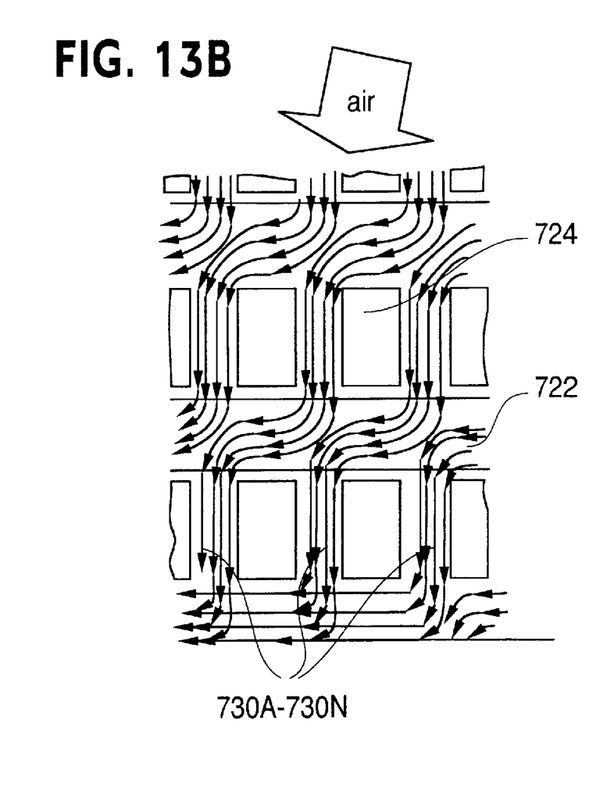

FIGS. 13A–13B illustrate an airflow direction of an example radial base heatsink according to an embodiment of the present invention. For purposes of illustration, the example radial base heatsink may be provided with angled fins as described with reference to FIG. 7. As shown in FIGS. 13A–13B, the example radial base heatsink 700 includes the same cylindrical core 710, and cooling fins 720A–720N. Individual cooling fins 724 may be uniformly arranged and separated by respective channels 730A–730N and cut lines 722 along vertical and horizontal directions on a peripheral outer wall surface of the cylindrical core 710. When an airflow is generated from a fan structure (not shown), heat generated from a heat source (not shown) may be transferred from the base surface of the cylindrical core 710 to the length of the cooling fins 720A–720N along the airflow direction shown in FIG. 13B.

Figures 14A, 14B, 14C, 15A, 15B, 15C:
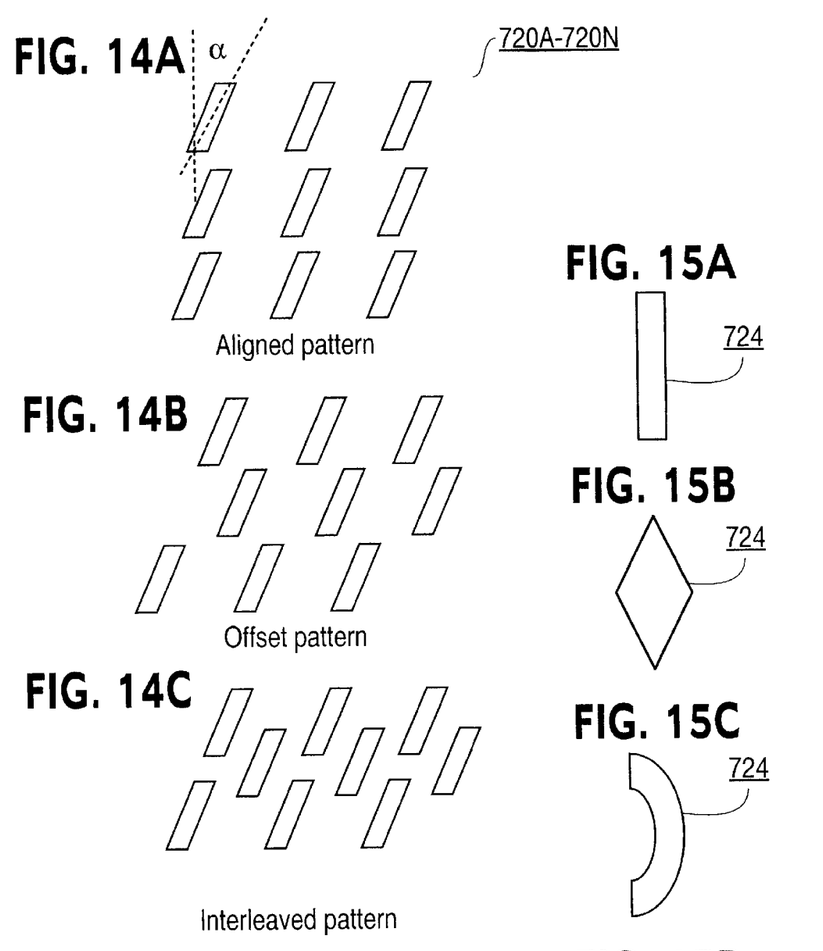

In order to reduce airflow resistance and increase fin efficiency, the cooling fins 720A–720N of the example radial base heatsink 700 shown in FIGS. 13A–13B may be arranged in several patterns, including an aligned pattern shown in FIG. 14A, an offset pattern shown in FIG. 14B, and an interleaved pattern shown in FIG. 14C. In each of the aligned pattern, the offset pattern, and the interleaved pattern, the individual cooling fins 720A–720N may also be arranged at a predetermined angle (α) for example, from 0° to 25°.

Figure 15D:
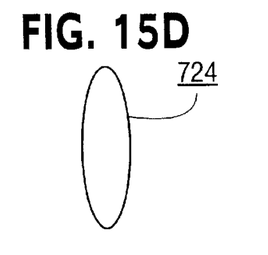

In addition, the cooling fins 720A–720N may also be configured with different fin shapes as shown in FIGS. 15A–15D. For example, individual cooling fins 724 may have an rectangular shape as shown in FIG. 15A, a diamond shape as shown in FIG. 15B, a curve and/or airfoil shape as shown in FIG. 15C, and an elliptical shape as shown in FIG. 15D. Fin shapes are not limited hereto as other fin shapes and configurations may also be available to reduce airflow resistance and increase airflow efficiency.

Figure 16:
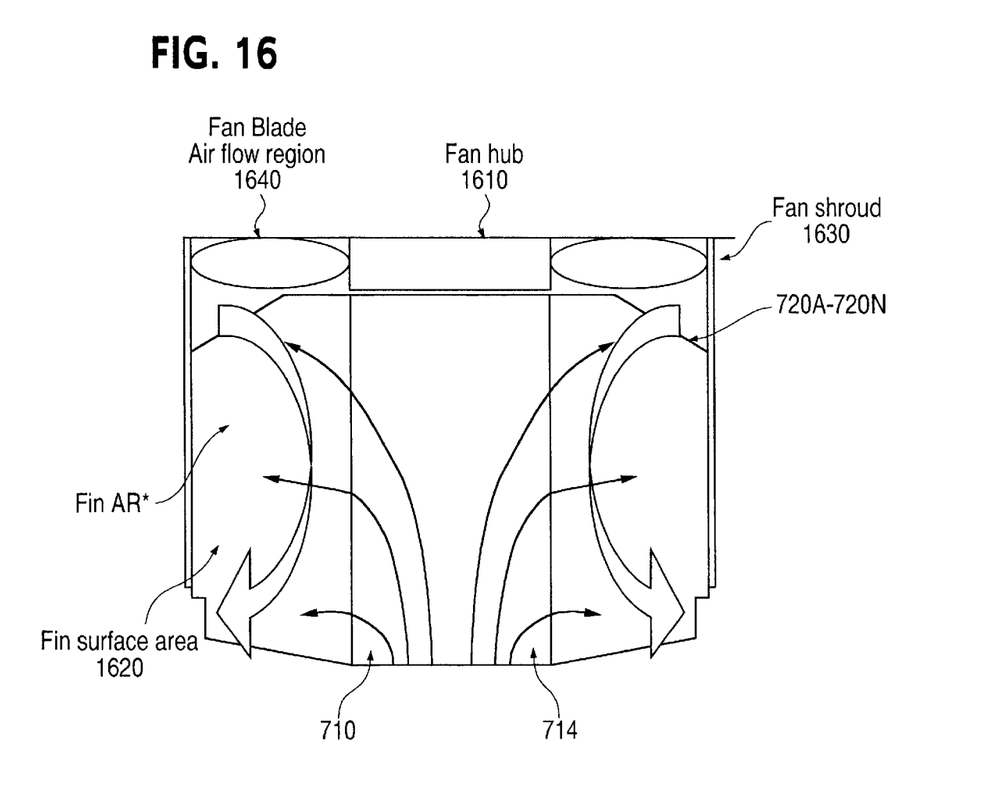
FIG. 16 illustrates an airflow simulation result of an example radial base heatsink according to an embodiment of the present invention.

FIG. 16 illustrates an airflow simulation result of an example radial base heatsink with different fin configurations, such as straight fins, angled fins, conical fins, pin type fins, airfoil fins or pre-fabricated bonded fins according to an embodiment of the present invention. As can be seen from the arrows shown in FIG. 16, there is no airflow recirculation. The cylindrical core 710 may be positioned directly underneath a fan hub 1610 where an airflow stagnation region resides to reduce any turbulent airflow. Heat dissipated from a heat source (not shown) can be efficiently transferred from the small base surface 714 of the cylindrical core 710 to the peripheral outer wall 716 and then to the length of cooling fins 720A–720N over the fin surface area 1620. Fan blade airflow regions 1640 formed by the fan shroud 1630 around the fan hub 1610 may be used to generate an airflow in an efficient way to transfer heat from the base surface of the cylindrical core 710 to the length of the cooling fins 720A–720N.

The shape of the fin edges and corners, which minimize air flow impedance, may be coupled with a fan shroud to allow air to flow over the entire fin surface with maximum mass flow rate at low fan speed.

The cooling fins 720A–720N are part of the cylindrical core 710 as shown in FIGS. 13A–13B to provide a low thermal resistance connection to the base. The cylindrical core thermal performance can also be improved by adding a vapor chamber, heat-pipe, high thermal conductive material (such as TC1050), or other similar method.

The heatsink cooling capacity may be determined by heat exchange effective surface area, the airflow over the same and the heat spreading efficiency inside the cylindrical core and cooling fins. Adding more cooling fins can increase the total heat exchange surface area. However, there may be a trade off with airflow resistance, which determines the overall efficiency of the radial base heatsink. Similarly, increasing fin height can also increase the fin surface area but it is also limited by fin efficiency and manufacturable aspect ratio. The cylindrical core can have up to twice as many fins (or more) compared to a rectangular based surface without losing heat transfer convective coefficient and fin efficiency. Radial fins match the airflow path from an active fan with maximized airflow efficiency. The cylindrical core can spread heat uniformly and more efficiently from a heat source, i.e., an electronic package such as a microprocessor to all the fins.

Actual dimension of a radial base heatsink may be based on the size and space on a motherboard supporting a heat source, i.e., an electronic package. Similarly, the size of the cylindrical core may be based on the size of the heat source. For example, if the size of the heat source is 1.875 inches, then the size of the cylindrical core of the radial base heatsink may correspond to 1.875 inches with an overall dimension of the heatsink of approximately 3 inches. However, the dimension of the radial base heatsink is not limited thereto. The fin height and length may be optimized based on the number of fins and fin shapes chosen based on the following equation:

$$Q = h \times A \times (Ts - Tam),$$

where Q is a power dissipation from a heat source;
h is a convection coefficient—a function of airflow rate, airflow efficiency, heatsink resistance and fin efficiency;
A is a total heatsink surface area (the number of fins chosen times the fin surface area);
Ts is a heatsink temperature; and
Tam is an ambient temperature for heatsink.

Typically, the power dissipation (Q) is a known fixed value based on the heat source. Likewise, the heatsink temperature (Ts) and the ambient temperature for heatsink (Tam) are also known fixed values. Then the heatsink surface area (A) which is based on the number of fins chosen and the fin surface area may have an inverse relationship with the convection coefficient (h). Therefore, the number of fins and the fin surface area must be chosen relative to the convection coefficient (h) to ensure that the fin height and length optimized.

As a result, the radial base heatsink designs as described with reference to FIGS. 6A–6D, FIGS. 7A–7D, FIGS. 8–12, FIGS. 13A–13B, 14A–14C and 15A–15D have a number of advantages over aluminum (Al) skived fin heatsinks and copper (Cu) base aluminum (Al) folded fin heatsinks. For example, the radial base heatsink with its easy machining shape is less expensive since large copper base material is not required. The radial mounting of the cooling fins advantageously allows higher fin density at the base with greater spacing between the fins further out thereby allowing twice the fin surface area and less airflow restriction. The cylindrical core may also transfer heat more directly to cooling fins so that fan hub "dead-zone" does not limit fan performance or require higher speed fans for less audible noise. As a result, all of the airflow may flow over the cooling fins to maximize the airflow efficiency. In addition, different fin configurations, such as straight fins, angled fins, conical fins, pin type fins, airfoil fins or pre-fabricated bonded fins with variable length and cut may be positioned to match the fan swirl to reduce airflow impedance.

Similarly, there are a number of advantages of the radial base heatsinks as described with reference to FIGS. 6A–6D, FIGS. 7A–7D, FIGS. 8–12, FIGS. 13A–13B, 14A–14C and 15A–15D over Mushroom base heatsink with machined or extruded fins. For example, the cylindrical core may transfer heat more directly to the fins over greater length so that there is no fan hub "dead-zone" and no air turbulence. As a result, all of the airflow may flow over the cooling fins to maximize the airflow efficiency. Larger base height may allow more options to improve base heat transfer with vapor chamber, heat pipe, conductive material, etc. In addition, radial mounting of the cooling fins offers more cooling surface area for less cost and more heat transfer.

Figure 17A:
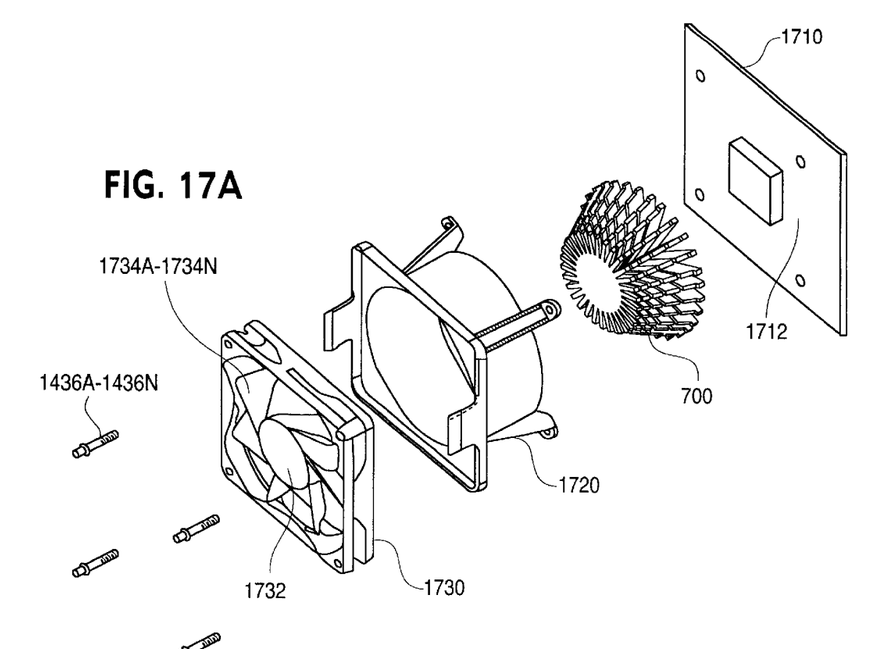
FIGS. 17A–17B illustrate an advanced heatsink assembly including an example radial base heatsink and a fan shroud and heatsink retention mechanism according to an embodiment of the present invention and FIGS. 18A–18B illustrate an example fan shroud and heatsink retention mechanism according to an embodiment of the present invention.
Figure 17B:
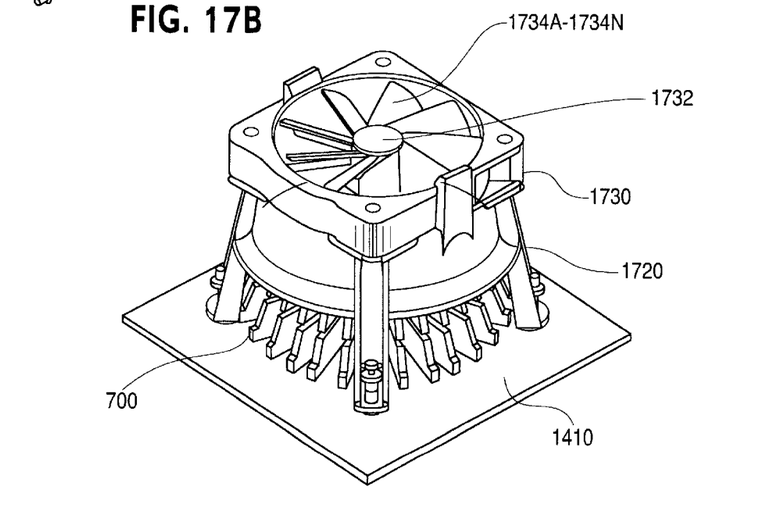

FIGS. 17A–17B illustrate an advanced heatsink assembly including a radial base heatsink and a fan shroud and heatsink retention mechanism according to an embodiment of the present invention. The heatsink assembly may include an example radial base heatsink 700 with angled fins as shown, for example, in FIGS. 7 and 13A–3B, positioned on top of a heat source, i.e., an electronic package 1712 mounted on a motherboard 1710, and a fan shroud and heatsink retention mechanism including a fan housing 1720, a fan structure 1730 and a plurality of spring loaded hardware 1736A–1736N used to secure the fan structure 1730 and the fan housing 1720 onto the motherboard 1710 as shown in FIG. 17B.

The fan structure 1720 may include a fan hub 1732 positioned substantially coaxially with the top surface of the cylindrical core 710 having substantially the same diameter as the top surface of the cylindrical core 710 for rotation about a fan rotation axis, and a plurality of fan blades 1734A–1734N extending radially from the fan hub 1732 for forcing air in an axial direction past a substantial portion of the blades 1734A–1734N.

Figure 18A:
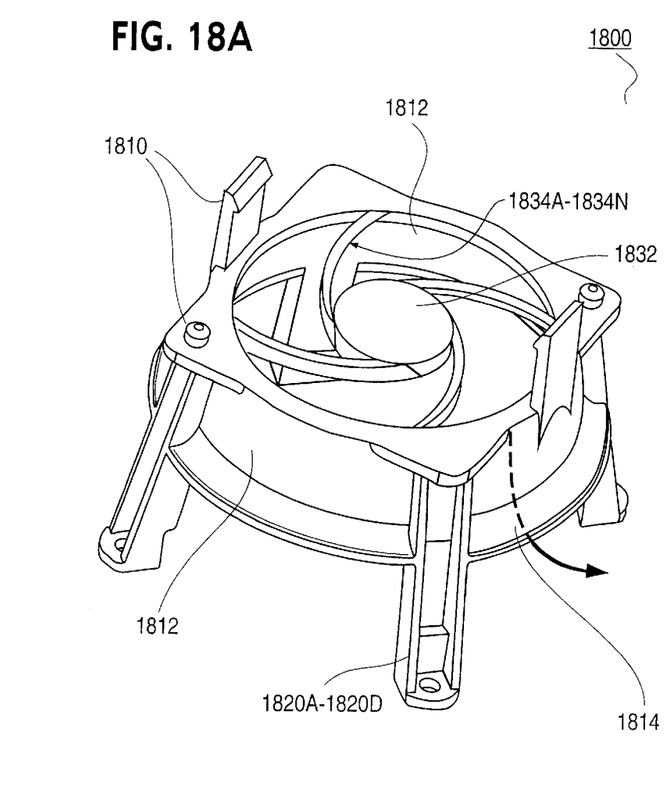
Figure 18B:
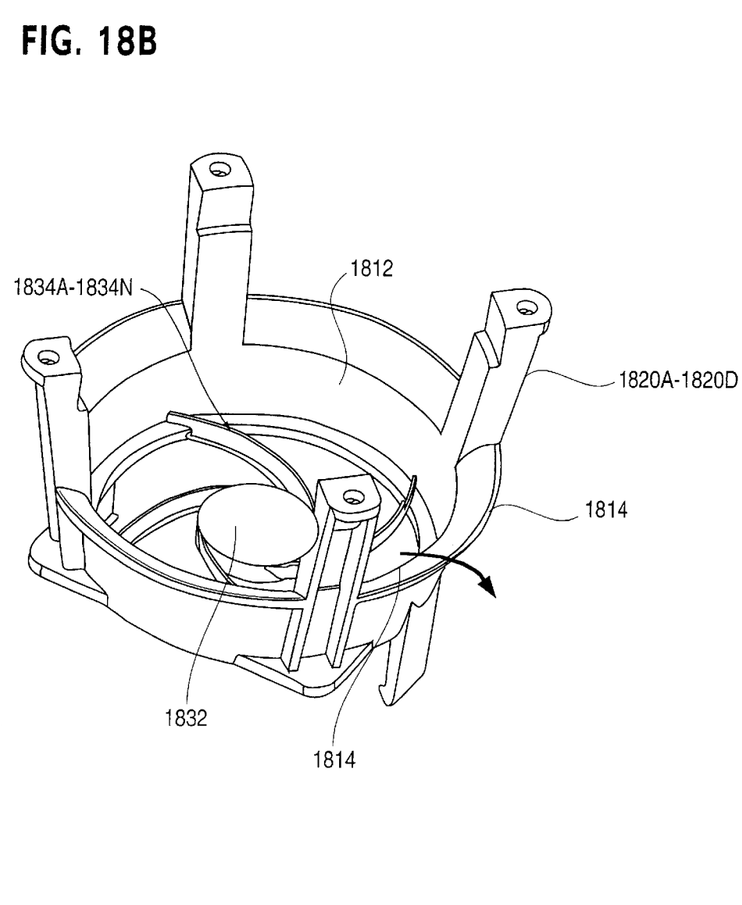

FIGS. 18A–18B illustrate an example fan shroud and heatsink retention mechanism according to another embodiment of the present invention. The example fan shroud and heatsink retention mechanism may be molded from a single piece of plastic and designed to secure the radial base heatsink onto a motherboard (not shown) and to maximize the airflow to enhance the heat transfer. As shown in FIGS. 18A–18B, the fan shroud and heatsink retention mechanism 1800 may include a fan housing 1810 having an air shroud 1812 and an airflow duct 1814 supported by, for example, four legs 1820A–1820D to be secured onto a motherboard (not shown), and a built-in fan structure 1830 having a fan hub 1832 and a plurality of fan blades 1834A–1834N serving as a swirl regulator to provide more straight airflow. The air shroud 1812 is the wall used to constrain the airflow to the fin area. The air duct 1814 is a continuation of that wall, and is extended from the bottom of the air shroud 1812 at an incline to reduce the pressure drop (or turbulence) of the airflow and enhance dispersion of the airflow outward from the redial base heatsink. As a result of the airshroud 1812 and the airflow duct 1814, the airflow exiting at the bottom of the radial base heatsink with straight fins, angled fins, conical fins, pin type fins, airfoil fins or prefabricated bonded fins according to an embodiment of the present invention may provide to other electronic components and the motherboard.

As described from the foregoing, the advanced heatsink design with different cooling fins configurations according to the present invention advantageously provides a low cost, quiet, lightweight heatsink solution that can provide up to twice the thermal performance of typical heatsinks in the same or smaller volume. Cooling fins with smaller fin ratio (ratio between fin height to fin thickness) can lead to higher fin efficiency. The radial base heatsink with a greater total surface fin area (the number of cooling fins times the fin surface area) can lead to a higher heatsink efficiency, less airflow loss, better airflow path, and more convection efficiency. Fan shroud and good fin configuration/design can also result in better airflow.

While there have been illustrated and described what are considered to be exemplary embodiments of the present invention, it will be understood by those skilled in the art and as technology develops: that various changes and modifications may be made, and equivalents may be substituted for elements thereof without departing from the true scope of the present invention. For example, the radial base heatsink may be available in a variety of size and shapes with different projections. The overall dimensions of the radial base heatsink may be altered depending upon the electrical elements used, the desired strength, the structural rigidity, and the thermal stability. More importantly, a wide variety of different fins configurations may be used in substitution of those described with reference to FIGS. 6A–6D, FIGS. 7A–7D, FIGS. 8–12, FIGS. 13A–13B, 14A–14C and 15A–15D as long as the cooling fins are extending in a radial pattern from a cylindrical core. In addition, different sizes and shapes of the fins may be alternatively used. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A heatsink comprising:
   a cylindrical core having a substantially planar top surface, a substantially planar base surface and a peripheral outer wall extending from the top surface to the base surface; and
   a plurality of cooling fins projecting outwardly from the peripheral outer wall of the cylindrical core and defining a series of channels in a substantially radial pattern with a fin orientation relative to a center line of the cylindrical core, to dissipate heat generated from a heat source, via the cylindrical core, wherein the cooling fins are separated and spaced-apart by respective channels along vertical and horizontal directions on the peripheral outer wall of the cylindrical core.

2. The heatsink as claimed in claim 1, wherein the substantially planar top surface of the cylindrical core is adapted to accommodate a fan hub, and the substantially planar base surface of the cylindrical core is adapted to contact the heat source.

3. The heatsink as claimed in claim 1, wherein the cylindrical core and the cooling fins are constructed from a single aluminum (Al) piece.

4. The heatsink as claimed in claim 1, wherein the cooling fins extending from the peripheral outer wall of the cylindrical core are arranged in one of an aligned pattern, an offset pattern, and an interleaved pattern.

5. The heatsink as claimed in claim 2, wherein the cooling fins are straight fins in which all cooling fins have a predetermined length, width, pattern and shape arranged uniformly along the peripheral outer wall of the cylindrical core.

6. The heatsink as claimed in claim 2, wherein the cooling fins are angled fins in which all cooling fins have a predetermined length, width, pattern and shape arranged uniformly along the peripheral outer wall of the cylindrical core at a predetermined angle.

7. The heatsink as claimed in claim 1, wherein the cooling fins are angled fins in which cooling fins are tapered from the planar top surface to the planar base surface along the peripheral outer wall of the cylindrical core at a predetermined angle.

8. The heatsink as claimed in claim 1, wherein the cooling fins are elongated conical fins, pin-type fins or pre-fabricated bonded fins.

9. The heatsink as claimed in claim 1, wherein the cooling fins are airfoil fins in which cooling fins are curved along a direction of a fan swirl.

10. The heatsink as claimed in claim 1, wherein the cylindrical core and the cooling fins are constructed from a single metallic piece that is light weight and has a high thermal conductivity, including a copper-tungsten alloy, aluminum nitride, beryllium oxide or copper.

11. The heatsink as claimed in claim 1, wherein the cooling fins are mounted onto the peripheral outer wall of the cylindrical core via solder, adhesive or other low thermal resistance material.

12. The heatsink as claimed in claim 1, wherein the heat source is a microprocessor.

13. A heatsink assembly, comprising:
   a circuit board to support a heat source;
   a radial base heatsink including a cylindrical core; and a plurality of cooling fins projecting outwardly from the cylindrical core in a substantially radial pattern with a fin orientation relative to a center line of the cylindrical core; and
   a fan shroud and heatsink retention mechanism arranged to secure the heatsink onto the circuit board to optimize heat transfer from the heat source, said fan shroud and heatsink retention mechanism having a housing to enclose the heatsink including the cooling fins, an air shroud to constrain the airflow over the cooling fins, and an airflow duct extending from the air shroud to reduce the pressure drop of the airflow as the airflow is dispersed outward from the heatsink, and a fan structure to secure the heatsink over the heat source.

14. The heatsink assembly as claimed in claim 13, wherein the fan structure comprises:
   a fan hub positioned substantially coaxially with a top surface of the cylindrical core and having substantially the same diameter as the top surface of the cylindrical core for rotation about a fan rotation axis; and
   a plurality of fan blades extending radially from the fan hub to create the airflow in an axial direction past a substantial portion of the blades.

15. The heatsink assembly as claimed in claim 14, wherein the cylindrical core of the radial base heatsink is a solid core, and includes a substantially planar top surfade adapted to accommodate the fan hub, a substantially planar base surface adapted to contact the heat source, and a peripheral outer wall extended from the top surface to the base surface.

16. The heatsink assembly as claimed in claim 14, wherein the cylindrical core and the cooling fins of the radial base heatsink are constructed from a single aluminum (Al) piece.

17. The heatsink assembly as claimed in claim 14, wherein the cooling fins of the radial base heatsink extending from the cylindrical core in the substantially radial pattern are spaced-apart along a horizontal direction relative to the center line of the cylindrical core.

18. The heatsink assembly as claimed in claim 14, wherein the cooling fins of the radial base heatsink are straight fins in which all cooling fins have a predetermined length, width, pattern and shape arranged uniformly along the peripheral outer wall of the cylindrical core.

19. The heatsink assembly as claimed in claim 14, wherein the cooling fins of the radial base heatsink are angled fins in which cooling fins are tapered from the planar top surface to the planar base surface at a predetermined angle.

20. The heatsink assembly as claimed in claim 14, wherein the cooling fins of the radial base heatsink angled fins in which all cooling fins have a predetermined length, width, pattern and shape arranged uniformly along the peripheral outer wall of the cylindrical core at a predetermined angle.

21. The heatsink assembly as claimed in claim 14, wherein the cooling fins of the radial base heatsink are elongated conical fins, pin-type fins or airfoil fins in which cooling fins are curved along a direction of a fan swirl.

22. The heatsink assembly as claimed in claim 14, wherein the cylindrical core and the cooling fins of the radial base heatsink are constructed from a single metallic piece that is light weight and has a high thermal conductivity, including a copper-tungsten alloy, aluminum nitride, beryllium oxide or copper.

23. A method of removing heat from a heat source, comprising:
   providing a heatsink having a cylindrical core, and a plurality of cooling fins projecting outwardly from a peripheral outer wall of the cylindrical core in a substantially radial pattern with a fin orientation relative to a center line of the cylindrical core, the cooling fins being separated and spaced-part by respective channels along vertical and horizontal directions on the peripheral outer wall of the cylindrical core;
   providing a fan shroud and heatsink retention mechanism having a fan housing with an air shroud and an airflow duct, and a fan structure with a fan hub and a plurality of fan blades;
   securing the heatsink over the heat source, via the fan shroud and heatsink retention mechanism, such that the cylindrical core of the heatsink is positioned between the heat source and the fan hub and the cooling fins are enclosed by the fan housing;
   transferring heat generated from the heat source to the cooling fins of the heatsink, via the cylindrical core of the heatsink; and
   causing airflow generated by the fan blades to move away from the cooling fins of the heatsink, via the air shroud and the airflow duct of the fan housing, to dissipate heat from the heat source.

24. The method as claimed in claim 23, wherein the cylindrical core and the cooling fins of the heatsink are constructed from a single metallic piece, and the cooling fins of the heatsink are straight fins in which all cooling fins have a predetermined length and width.

25. The method as claimed in claim 23, wherein the cooling fins of the heatsink are angled fins in which cooling fins are tapered from the top surface to the base surface at a predetermined angle.

26. The method as claimed in claim 25, wherein the cooling fins of the radial base heatsink are elongated conical fins, pin-type fins, airfoil fins in which cooling fins are curved along a direction of a fan swirl, or pre-fabricated bonded fins in which cooling fins are mounted on an outer wall of the cylindrical core.

27. A heatsink comprising:
   a substantially solid conical core having a planar top surface, a planar base surface larger than the planar top surface, and a peripheral outer wall extending from the top surface to the base surface; and
   a plurality of cooling fins projecting outwardly from the peripheral outer wall of the conical core and defining a series of channels in a substantially radial pattern with a fin orientation relative to a center line of the conical core and with each channel separating adjacent cooling fins on the peripheral outer wall extending from the top surface to the base surface of the conical core, to dissipate heat generated from a heat source, via the conical core.

28. The heatsink as claimed in claim 27, wherein the cooling fins are separated and spaced-apart by respective channels along vertical and horizontal directions on the peripheral outer wall of the conical core.

29. The heatsink as claimed in claim 27, wherein the conical core and the cooling fins are constructed from a single aluminum (Al) piece that is light weight and has a high thermal conductivity, including a copper-tungsten alloy, aluminum nitride, beryllium oxide or copper.

30. The heatsink as claimed in claim 27, wherein the cooling fins extending from the peripheral outer wall of the conical core are arranged in one of an aligned pattern, an offset pattern, and an interleaved pattern.

31. The heatsink as claimed in claim 27, wherein the cooling fins are straight fins in which all cooling fins have a predetermined length, width, pattern and shape arranged uniformly along the peripheral outer wall of the cylindrical core.

32. The heatsink as claimed in claim 27, wherein the cooling fins are angled fins in which all cooling fins have a predetermined length, width, pattern and shape arranged uniformly along the peripheral outer wall of the cylindrical core at a predetermined angle.

* * * * *